United States Patent
Noiray et al.

(10) Patent No.: US 9,127,340 B2
(45) Date of Patent: Sep. 8, 2015

(54) SELECTIVE OXIDATION PROCESS

(75) Inventors: Jerome Noiray, Leuven (BE); Ernst H. A. Granneman, Hilversum (NL)

(73) Assignee: ASM INTERNATIONAL N.V. (NL)

(*) Notice: Subject to any disclaimer, the term of this patent is extended or adjusted under 35 U.S.C. 154(b) by 440 days.

(21) Appl. No.: 12/701,422

(22) Filed: Feb. 5, 2010

(65) Prior Publication Data

US 2010/0209597 A1    Aug. 19, 2010

Related U.S. Application Data

(60) Provisional application No. 61/152,617, filed on Feb. 13, 2009.

(51) Int. Cl.
| | |
|---|---|
| *B05D 5/12* | (2006.01) |
| *C23C 8/04* | (2006.01) |
| *C23C 8/10* | (2006.01) |
| *H01L 21/02* | (2006.01) |
| *H01L 21/28* | (2006.01) |
| *H01L 21/314* | (2006.01) |
| *H01L 21/316* | (2006.01) |

(52) U.S. Cl.
CPC ... *C23C 8/04* (2013.01); *C23C 8/10* (2013.01); *H01L 21/02238* (2013.01); *H01L 21/02249* (2013.01); *H01L 21/28247* (2013.01); *H01L 21/3144* (2013.01); *H01L 21/31662* (2013.01)

(58) Field of Classification Search
USPC ............. 427/58, 96.8, 98.4, 99.2, 377, 379
See application file for complete search history.

(56) References Cited

U.S. PATENT DOCUMENTS

| | | | |
|---|---|---|---|
| 4,505,028 A * | 3/1985 | Kobayashi et al. | ............ 438/301 |
| 4,906,595 A | 3/1990 | van der Plas et al. | |
| 5,008,160 A | 4/1991 | Jenkin | |
| 5,132,756 A | 7/1992 | Matsuda | |
| 5,352,656 A | 10/1994 | Lackey et al. | |
| 5,545,578 A | 8/1996 | Park et al. | |
| 5,589,421 A | 12/1996 | Miyashita et al. | |
| 5,604,140 A | 2/1997 | Byun | |

(Continued)

FOREIGN PATENT DOCUMENTS

| | | |
|---|---|---|
| JP | 58-123866 | 7/1983 |
| JP | 12-04448 | 8/1989 |

(Continued)

OTHER PUBLICATIONS

Audisio, "Chemical Vapor Deposition of Tin on Iron or Carburized Iron," J. Electrochem Soc., Oct. 1980, pp. 2299-2304, vol. 127, Issue 10, Laboratoire de Physicochimie Industrielle, Institut National des Sciences Appliquees de Lyon, Villeurbanne Cedex, France.

(Continued)

*Primary Examiner* — Brian K Talbot
(74) *Attorney, Agent, or Firm* — Knobbe, Martens, Olson & Bear, LLP

(57) ABSTRACT

Silicon is selectively oxidized relative to a metal-containing material in a partially-fabricated integrated circuit. In some embodiments, the silicon and metal-containing materials are exposed portions of a partially-fabricated integrated circuit and may form part of, e.g., a transistor. The silicon and metal-containing material are oxidized in an atmosphere containing an oxidant and a reducing agent. In some embodiments, the reducing agent is present at a concentration of about 10 vol % or less.

23 Claims, 9 Drawing Sheets

(56) References Cited

U.S. PATENT DOCUMENTS

| | | | |
|---|---|---|---|
| 5,756,392 | A | 5/1998 | Lu et al. |
| 5,810,929 | A | 9/1998 | Yuuki |
| 5,814,556 | A | 9/1998 | Wee et al. |
| 5,821,172 | A | 10/1998 | Gilmer et al. |
| 5,834,068 | A | 11/1998 | Chern et al. |
| 5,872,017 | A | 2/1999 | Boydston et al. |
| 5,916,378 | A | 6/1999 | Bailey et al. |
| 5,985,691 | A | 11/1999 | Basol et al. |
| 6,037,273 | A | 3/2000 | Gronet et al. |
| 6,162,741 | A * | 12/2000 | Akasaka et al. ............ 438/773 |
| 6,177,334 | B1 * | 1/2001 | Chen et al. ................. 438/584 |
| 6,193,911 | B1 | 2/2001 | Hunt et al. |
| 6,197,702 | B1 * | 3/2001 | Tanabe et al. .............. 438/773 |
| 6,204,204 | B1 | 3/2001 | Paranjpe et al. |
| 6,265,297 | B1 * | 7/2001 | Powell ......................... 438/592 |
| 6,284,634 | B1 | 9/2001 | Rha |
| 6,306,756 | B1 | 10/2001 | Hasunuma et al. |
| 6,310,327 | B1 | 10/2001 | Moore et al. |
| 6,410,456 | B1 | 6/2002 | Gronet et al. |
| 6,425,951 | B1 | 7/2002 | Chu et al. |
| 6,458,714 | B1 | 10/2002 | Powell et al. |
| 6,482,740 | B2 * | 11/2002 | Soininen et al. ............ 438/686 |
| 6,500,350 | B1 | 12/2002 | Hunt et al. |
| 6,503,819 | B2 | 1/2003 | Tanabe et al. |
| 6,734,531 | B2 * | 5/2004 | Weimer et al. ............... 257/629 |
| 6,740,594 | B2 * | 5/2004 | Lu et al. ...................... 438/703 |
| 6,743,473 | B1 | 6/2004 | Parkhe et al. |
| 6,764,961 | B2 * | 7/2004 | Ku et al. ..................... 438/770 |
| 6,835,672 | B1 * | 12/2004 | Park et al. ................... 438/770 |
| 6,890,867 | B2 | 5/2005 | Powell |
| 6,916,744 | B2 | 7/2005 | Achutharaman et al. |
| 7,015,151 | B2 | 3/2006 | Powell |
| 7,022,541 | B1 | 4/2006 | Yenilmez et al. |
| 7,049,187 | B2 | 5/2006 | Yamamoto et al. |
| 7,129,188 | B2 | 10/2006 | Powell |
| 7,186,632 | B2 | 3/2007 | Ogawa et al. |
| 7,238,595 | B2 | 7/2007 | Brabant et al. |
| 7,288,205 | B2 * | 10/2007 | Lakshmanan et al. ......... 216/67 |
| 7,435,665 | B2 | 10/2008 | Airaksinen et al. |
| 7,550,353 | B2 | 6/2009 | Lee et al. |
| 7,678,678 | B2 | 3/2010 | Gonzalez et al. |
| 7,736,963 | B2 * | 6/2010 | Lee et al. ..................... 438/197 |
| 7,829,457 | B2 | 11/2010 | Yoshimi et al. |
| 8,569,828 | B2 | 10/2013 | Yaegashi |
| 2001/0010975 | A1 * | 8/2001 | Tanabe et al. ................ 438/770 |
| 2001/0025971 | A1 | 10/2001 | Powell |
| 2002/0052124 | A1 | 5/2002 | Raaijmakers et al. |
| 2002/0092584 | A1 | 7/2002 | Soininen et al. |
| 2003/0173347 | A1 | 9/2003 | Guiver |
| 2004/0047993 | A1 | 3/2004 | Kumar et al. |
| 2004/0154185 | A1 | 8/2004 | Morad et al. |
| 2006/0240680 | A1 | 10/2006 | Yokota et al. |
| 2006/0252258 | A1 | 11/2006 | Wu et al. |
| 2008/0054326 | A1 | 3/2008 | Wong et al. |
| 2008/0166893 | A1 * | 7/2008 | Byun et al. ................... 438/798 |
| 2009/0269939 | A1 * | 10/2009 | Sprey ........................... 438/773 |

FOREIGN PATENT DOCUMENTS

| | | |
|---|---|---|
| JP | 02-025559 | 1/1990 |
| JP | 11-330468 | 11/1999 |
| JP | 2001-262378 | 9/2001 |
| JP | 2003-338623 | 11/2003 |
| JP | 2005-277386 | 10/2005 |
| WO | WO 93/19222 | 9/1993 |

OTHER PUBLICATIONS

Behner, "Surface composition of CVD-grown a-SiC layers—an XPS and LEED study," Applied Surface Science, May 1996, pp. 27-33, vol. 99, Issue 1.

Champeaux, "In situ growth of YBaCuO superconducting thin films by excimer laser ablation: influence of deposition and cooling parameters," Applied Surface Science, May 1993, pp. 335-339, vol. 69, Issues 1-4.

Chen et al., "Oxidation behavior of titanium nitride films," J. Vac. Sci. Technol. A 23(4), pp. 1006-1009 (Jul./Aug. 2005).

Frohlich, "Characterization of rare earth oxides based MOSFET gate stacks prepared by metal-organic chemical vapour deposition," Materials Science in Semiconductor Processing, Dec. 2006, pp. 1065-1072, vol. 9, Issue 6.

Galata, "Post deposition annealing studies of lanthanum aluminate and ceria high-k dielectrics on germanium," Microelectronics Reliability, Apr.-May 2007, pp. 532-535, vol. 47, Issues 4-5.

Lu, "A Novel Process for Fabricating Conformal and Stable TiN-Based Barrier Films," J. Electrochem Soc., Dec. 1996, pp. L279-L280, vol. 143, Issue 12, Texas Instruments, Dallas, Texas, United States.

Mori, "Effect of Ambient on the Surface Resistance of Diamond Films during Cooling after Deposition," Japanese Journal of Applied Physics, 1992, pp. L1718-L1720, vol. 31, Osaka University, 2-1 Yamada-oka, Suita, Osaka 565.

Reitmeier, "In situ cleaning of GaN(0001) surfaces in a metalorganic vapor phase epitaxy environment," J. Vac. Sci. Technol., Sep. 2004, p. 2077-2082, vol. 22, Issue 5, North Carolina State University, Raleigh, North Carolina, United States.

Saha et al., "Titanium nitride oxidation chemistry: An x-ray photoelectron spectroscopy study," J. Appl. Phys. 72 (7), pp. 3072-3079 (Oct. 1, 1992).

Tenne, "Characterization of oriented thin films of WSe2 grown by van der Waals rheotaxy," Thin Solid Films, Jan. 1996, pp. 38-42, vol. 272, Issue 1.

Verrelli, "Deposition and electrical characterization of hafnium oxide films on silicon," Physica status solidi, pp. 3720-3723, vol. 5, Issue 5, Greece.

Yamamoto et al., "Thermal Stability of Nitrogen in WNx Barriers Applied to Polymetal Gates," J. Vac. Soc. Technol. B. 23(4), pp. 1664-1673 (Jul./Aug. 2005).

Yim, "Dependence of the electrical and optical properties of sputter-deposited ZnO: Ga films on the annealing temperature, time, and atmosphere," Journal of Materials Science: Materials in Electronics, Apr. 2007, pp. 385-390, vol. 18, No. 4, Kluwer Academic Publishers, Inha University, Inchon, South Korea.

Office Action dated Apr. 1, 2014 in Japanese Patent Application No. 2010-027166 with English Translation.

* cited by examiner

SELECTIVE OXIDATION PROCESS

REFERENCE TO RELATED APPLICATIONS

This application claims the priority benefit under 35 U.S.C. §119(e) of provisional Application No. 61/152,617, filed Feb. 13, 2009.

This application is related to Co-pending application Ser. No. 12/701,407, filed on even date herewith, entitled SELECTIVE REMOVAL OF OXYGEN FROM METAL CONTAINING MATERIALS.

BACKGROUND

1. Field of the Invention

This application relates to semiconductor processing and, more particularly, to the selective oxidation of silicon relative to metal-containing materials, such as metal nitrides.

2. Description of the Related Art

Semiconductor device fabrication is a complex process. Devices are typically formed on a semiconductor substrate, and often include conductive elements separated by insulating elements. Conductive elements may serve as electrodes and interconnecting conductors, and may be formed from materials such as polysilicon or metal.

Various electronic devices, such as transistor devices, exist in the modern day fabrication of integrated circuits, with metal-oxide-semiconductor field-effect transistors (MOSFET) being a common transistor device. Generally, a MOSFET includes a conductive gate electrode formed over a gate dielectric, which in turn overlies a semiconductor substrate that is typically single-crystal silicon. For reliable MOSFET performance, it is important to maintain the conductivity of the gate electrode, which may be composed of conductive materials such as metal or metal nitride.

To achieve a MOSFET with desirable characteristics, oxidation is often performed on certain components in a semiconductor device, such as to form dielectrics. For example, silicon oxide can be created by oxidizing a silicon substrate. Unfortunately, conditions during the oxidation of silicon materials often result in oxidation of exposed metals. For example, performing oxidation of a silicon substrate while a metal or metal nitride structure is exposed can result in a layer of metal oxide forming around the metal or metal nitride. This metal oxide layer consumes the desired metal or metal nitride, reducing the conductive metal volume available for conducting current. As dimensions continually scale down, oxidation could effectively destroy the metal or metal nitride.

Since the metal or metal nitride may be readily oxidized to a point that its overall resistance is increased beyond useable levels, there is a need for selective oxidation. Selective oxidation employs methods that form the desired oxide components while at the same time minimize or preclude oxidation of, or oxide formation in, other components whose properties may be adversely affected by oxidation. Methods exist for selective oxidation that can effectively protect tungsten and molybdenum while oxidizing silicon. However, known selective oxidation techniques, such as use of dilute water vapor in $H_2$ gas, while effective for preventing oxidation of tungsten, are ineffective at the protection of, e.g., titanium or titanium nitride.

Accordingly, there is a need for selective oxidation processes directed to maintaining the integrity of exposed metal-containing parts, such as titanium structures, while forming desired oxides in other exposed parts and preventing the nitridation of such desired oxides or reducing the nitridation of such desired oxides to acceptably low levels.

SUMMARY

According to some aspects of the invention, a method for selective oxidation is provided. The method comprises providing a partially-fabricated integrated circuit. The partially-fabricated integrated circuit includes an exposed metal-containing portion and an exposed silicon portion. The exposed silicon portion is oxidized by exposing the partially-fabricated integrated circuit to an atmosphere containing an oxidant and a reducing agent, with the reducing agent at a concentration of about 10 vol % or less.

According to some other aspects of the invention, a method for selective oxidation is provided. The method comprises providing a partially-fabricated electronic device having an exposed metal-containing portion and an exposed silicon portion. The exposed silicon portion is oxidized by exposing the exposed silicon and metal-containing portions to an oxidant. The exposed silicon and metal-containing portions are exposed to a reducing agent during oxidizing. After oxidizing, an oxygen concentration in the exposed metal-containing portion is about 2 atomic % or less and a nitrogen concentration at an exposed surface of the silicon portion is about 20 atomic % or less.

BRIEF DESCRIPTION OF THE DRAWINGS

Various features, aspects and advantages of the various devices, systems and methods presented herein are described with reference to drawings of certain embodiments, which are intended to illustrate, but not to limit, such devices, systems, and methods. It is to be understood that the attached drawings are for the purpose of illustrating concepts of the embodiments discussed herein and may not be to scale.

DETAILED DESCRIPTION

Figure 1:
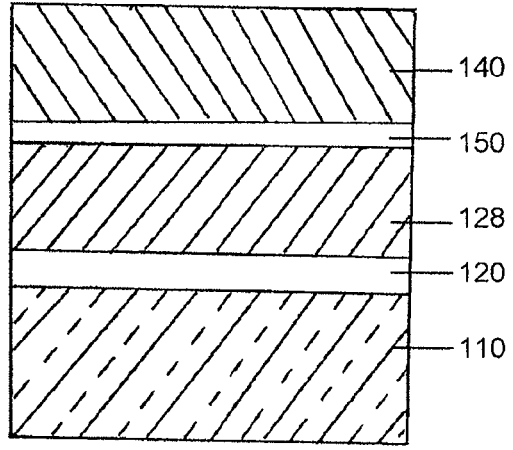
FIG. 1 is a schematic cross-sectional view of a partially-formed semiconductor device, according to some embodiments of the invention.

Bulk metal portions of partially-fabricated integrated circuits can include, e.g., gate electrodes for transistors. Passivation layers can be formed on the bulk metal portions to protect them from subsequent oxidation processes. For example, the surface of the bulk metal can be nitrided to form a metal nitride to protect the interior bulk metal from oxidants that are used to form oxides on other parts of the partially-fabricated integrated circuit.

It has been found, however, that metal nitrides can also be oxidized by the oxidants used to form an oxide. The oxidized metal nitride can have a high sheet resistivity, which is undesirable since the metal nitrides can be used to form integrated circuit structures that function to conduct current.

In U.S. Pat. No. 6,265,297 the addition of $NH_3$ to a selective oxidation ambient has been suggested. This patent discloses $NH_3$ amounts between 1,000 sccm and 10,000 sccm and $H_2O$ amounts between 50 sccm and 1,000 sccm for the selective oxidation. It has been found that this oxidation process can have difficulties with silicon oxide formation.

Without being limited by theory, it is believed that the high levels of $NH_3$ competes with and hampers the oxidation of the silicon. Moreover, the $NH_3$ undesirably nitridizes silicon oxide that has been formed.

According to some embodiments of the invention, methods are provided for selectively oxidizing exposed silicon portions of a partially-fabricated integrated circuit relative to exposed metal-containing portions of the partially-fabricated integrated circuit. The partially-fabricated integrated circuit is oxidized in a process chamber. During the oxidation, a reducing agent is provided at a low level in the process chamber along with an oxidant for the oxidation. The concentration of the reducing agent can be about 10 volume percent (vol %) or less, or about 1 vol % or less, or about 0.4 vol % or less.

In some embodiments, silicon is selectively oxidized relative to a metal nitride, such as titanium nitride (TiN). Advantageously, the selective oxidization results in the metal nitride having a low oxygen content. By achieving a low oxygen content in the metal nitride films, metal films with a low sheet resistance can be realized. In some embodiments, the oxygen content in a TiN film is about 2 atomic percent (at. %) or less, about 1-2 at. %, or about 1.0 at. % or less after the oxidation, thereby forming a TiN film with an advantageously low sheet resistance.

Various reducing agents can be provided in the process chamber during the oxidation. Examples of reducing agents include nitrogen-containing reducing agents, such as $NH_3$, hydrazine, and hydrazine derivatives. In some other embodiments, the reducing agent is an organic reducing agent, which preferably has at least one functional group selected from the group consisting of an alcohol group (—OH), an aldehyde group (—CHO), and a carboxylic acid group (—COOH). The reducing agent may be flowed into the process chamber with a carrier gas. It will be appreciated that the reducing agent is a stronger reducer than the carrier gas species.

It will be appreciated that nitrogen-containing reducing agents can be a source of nitrogen and that nitridation of the oxidized silicon is undesirable in some applications. In addition, the reducing agent can hamper the formation of the silicon oxide. Advantageously, it has been found that nitridation of silicon oxide can be suppressed while also suppressing oxidation of metal or metal nitrides. At the levels of reducing agent disclosed herein, oxide films can be formed to a sufficient desired thickness, e.g., about 0.5 nm or more, or about 1 nm or more, while the oxygen content of the metal or metal nitride is about 2 at. % or less, or about 1 at. % or less. Preferably, the nitrogen concentration of the surface of the oxide film is about 10 at. % or less or about 10 at. % or less.

In an alternative embodiment, a non-nitriding organic reducing agent that does not hamper the formation of silicon oxide on exposed silicon while adequately preventing oxidation of the exposed metal or metal nitride is added to the selective oxidation process with the nitrogen-containing reducing agent, or in place of the nitrogen-containing reducing agent.

Reference will now be made to the Figures, in which like numerals refer to like parts throughout. It will be appreciated that the selective oxidation process disclosed herein is applicable to various structures having exposed silicon and metal-containing surfaces. In some particularly advantageous embodiments, the structures have exposed silicon adjacent exposed TiN.

With reference to FIG. 1, the structure can include a transistor gate stack overlying a silicon substrate. The transistor gate stack can include a gate electrode structure having a lower and an upper electrode. The upper electrode includes a transition metal, e.g., titanium metal, and can consist essentially of titanium.

FIG. 1 illustrates a schematic cross-sectional view of a partially-fabricated integrated circuit 100. The partially-fabricated integrated circuit 100 includes a plurality of semiconductor device layers including a silicon semiconductor substrate 110, a gate dielectric layer 120, a conductive layer 128 for use as a lower electrode and a transition metal/metal nitride layer 140 for use as an upper electrode. The silicon semiconductor substrate 110 is typically formed on or is part of a silicon wafer. The gate dielectric 120 can be silicon oxide, a high k material, or multi-layer combinations of different dielectric materials. In one embodiment, and as shown in FIG. 1, a conductive layer 128, formed of polysilicon, metal, metal alloys or metal silicide, is formed over the gate dielectric layer 120 for use as a lower electrode. The transition metal/metal nitride layer 140 is formed over the conductive layer 128 for use as an upper electrode. In some embodiments, layer 140 has a thickness between about 5 nm and about 100 nm. In one embodiment, layer 140 has a thickness of approximately 20 nm. With the layers shown in FIG. 1, a MOSFET device can be established having gate, source and drain regions, by depositing and/or etching appropriate materials and injecting appropriate dopants into selected regions, as known in the art.

In some embodiments, additional conductive or insulating layers may be provided. For example, with continued reference to FIG. 1, a diffusion barrier 150 can be provided between layer 140 and the conductive layer 128. The diffusion barrier 150 can be a non-reactive, thin conductive film that acts as a diffusion barrier between the different materials forming the upper and lower electrodes 144, 130 (FIG. 2).

Figure 2:
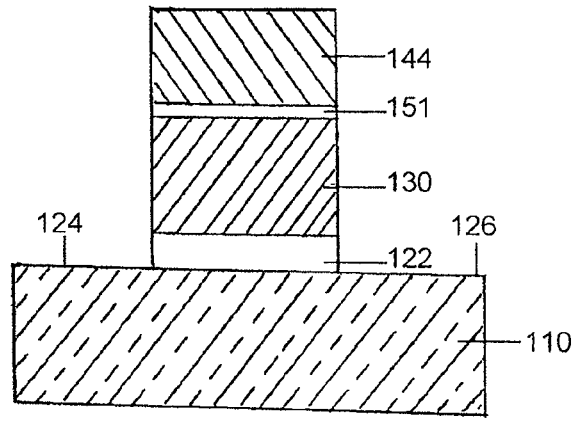
FIG. 2 is a schematic cross-sectional view of the partially-formed semiconductor device of FIG. 1 after subjecting the device to a patterning process, according to some embodiments of the invention.

FIG. 2 illustrates the partially-fabricated integrated circuit 100 of FIG. 1 after masking and etching the stacked layers to form a gate stack. After etching to form the gate stack, any overlying mask, if present, is removed. Thus, the etch forms an upper gate electrode 144, an etched diffusion barrier 151, a lower gate electrode 130, and an etched gate dielectric layer 122.

After etching the partially-fabricated integrated circuit 100, exposed silicon is oxidized. As shown in FIG. 2, the silicon substrate 110 has exposed silicon areas 124, 126 that may be damaged by the etch process. Oxidizing these areas can repair the surface silicon, where, it will be understood, the source or drain areas of the transistor may also be located. In some cases, the exposed silicon areas 124, 126 may have overlying dielectric layers (not illustrated), such as silicon oxide layers, which were damaged during the etching process. The overlying dielectric can be re-oxidized to repair the dielectric, or a lower interfacial oxide can be grown through the dielectric. In some embodiments, oxidation of other areas besides the exposed silicon substrate can be desired as well, including the lower electrode 130.

Figure 3:
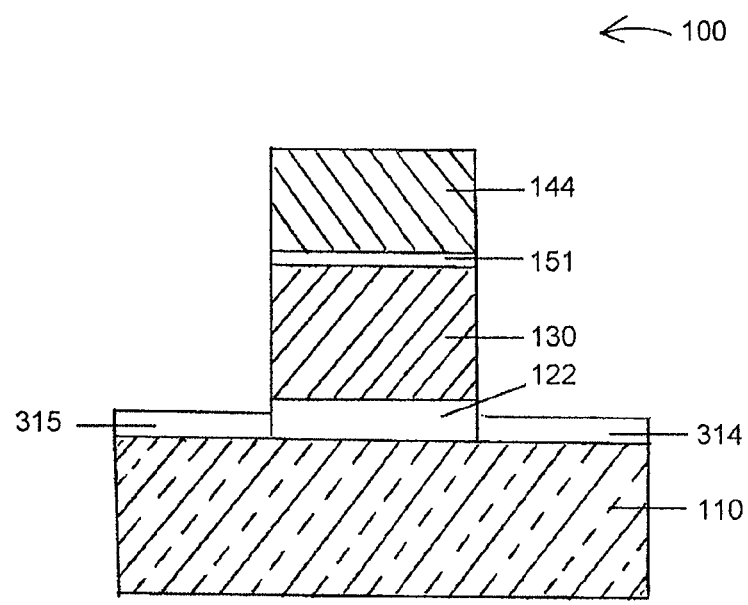
FIG. 3 is a schematic cross-sectional view of the partially-formed semiconductor device of FIG. 2 after subjecting the device to an oxidation process, according to some embodiments of the invention.

With reference to FIG. 3, the partially-fabricated integrated circuit 100 is subsequently subjected to a selective oxidation process. In some embodiments, the exposed silicon areas 124, 126 and the upper electrode 144, diffusion barrier 151 and lower electrode 130 are exposed to an oxidizing agent that includes water vapor. Water vapor selectively oxidizes the silicon areas 124, 126 (FIG. 2) to form silicon oxide (e.g., thermal $SiO_2$) layers 314, 315 while the conductive metal of the electrode stack is only slightly oxidized.

In one embodiment, the silicon is at a temperature between about 550° C. and about 900° C., and more preferably between about 650° C. and about 850° C. during the oxidation. In a preferred embodiment, the oxidation takes place at about 750° C. The oxidation may take place in a chamber having a water vapor concentration in a range between about 0.0005% and about 90% by volume, diluted in hydrogen, with a higher water vapor pressure resulting in enhanced oxidation but lower selectivity. A preferred oxidant mixture includes about 0.05 vol. % to about 20 vol. % water vapor diluted in hydrogen. Depending on conditions, such as temperature and pressure, in the process chamber, the duration of the oxidation may be between about 2 minutes and about 240 minutes. In one embodiment, oxidation takes place for 30 minutes in a chamber at 750° C., resulting in a silicon oxide layer 314 that has a thickness between about 20 Å and about 30 Å formed on the exposed silicon.

In some embodiments, upper electrode 144 consists primarily of a metal but is covered on its outer surface with a protective layer of metal nitride as metal nitrides can better withstand selective oxidation conditions than the pure metals. The protective metal nitride film can be formed by nitridation of the metal electrode in a nitrogen containing ambient, or can be deposited by a deposition method such as, without limitation, CVD, ALD or PVD.

In accordance with some embodiments of the invention, a reducing agent is provided in the process chamber, along with an oxidant, during the oxidation. It has been found that exceptionally low levels of reducing agent are effective at preventing oxidation of the titanium nitride or keeping oxidation at negligible levels. In some embodiments, the reducing agent is present in the process chamber at a concentration of about 10 vol. % or less, or about 1 vol. % or less, or about 0.4 vol. % or less.

After the oxidation, the concentration of oxygen in the metal nitride is, e.g., about 2 at % or less, or about 1 at % or less in some embodiments. Advantageously low sheet resistances are achieved at these oxygen concentrations. It will be appreciated that an anneal can lower the sheet resistance of the metal nitride, in the absence of subjecting the metal nitride to an oxidation with an oxidant. On the other hand, an oxidation can increase the sheet resistance of the metal nitride. Advantageously, in some embodiments, the decrease in the sheet resistance after the selective oxidation is similar to the decrease caused by an anneal without oxidation. For example, the ratio of the sheet resistance ($R_s$) after the selective oxidation and before the selective oxidation ($R_{s\ post-oxidation}/R_{s\ pre-oxidation}$) can be about 0.3 or less, or about 0.25 or less.

Figure 4:
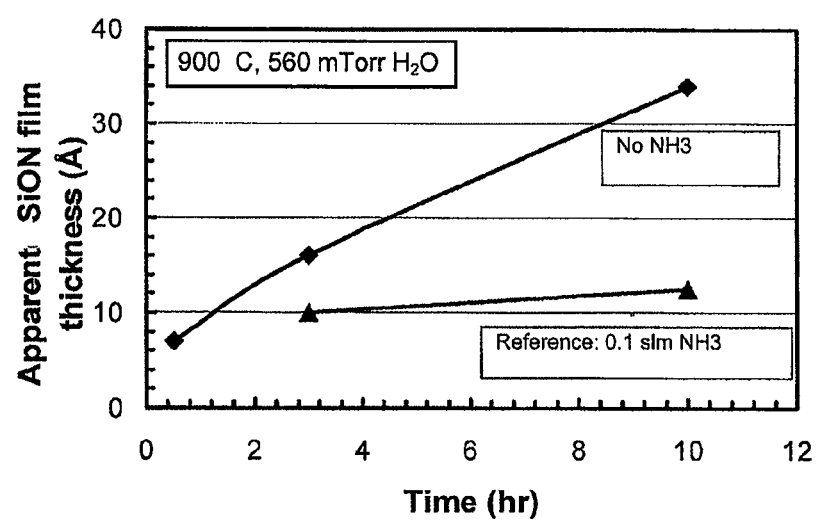
FIG. 4 shows the apparent SiON film thickness of a silicon oxide film formed by a selective oxidation process, with and without the addition of $NH_3$.

Reducing agents can prevent the formation of silicon oxide of desired thicknesses for some applications, such as during the formation of transistors and the repairing of silicon surfaces. For example, the reduction reaction can compete with the oxidation reaction, thereby preventing the formation of thick silicon oxide layers. In addition, nitridation of the oxide can also hamper formation of silicon oxide films. This is shown in FIG. 4. The increase of an SiO(N) layer in selective oxidation conditions is shown as a function of time for 900° C., using a flow of 20 slm $H_2$. In addition, a flow of 5 slm $N_2$ or 4.9 slm $N_2$ and 0.1 slm $NH_3$ was applied. The $H_2O$ partial vapor pressure was 560 mTorr. The SiO(N) film thickness was measured using an ellipsometer wherein during the analysis the refractive index was kept fixed. It can be observed that the addition of $NH_3$ results in a strong reduction of the silicon oxide growth rate, which is undesirable. Advantageously, embodiments of the invention can allow for the formation of relatively thick silicon oxide layers, while providing reducing agent in the process chamber during oxidation. In some embodiments, the silicon oxide layers have a thickness of about 0.5 nm or more, or about 1.0 nm or more, e.g., about 0.5-6 nm or about 1-3 nm.

It will be appreciated that elements from the reducing agent may be incorporated into the oxidized material. For example, where the reducing agent is a nitrogen-containing compound, nitrogen may be incorporated into the oxidized material, forming, e.g., SiON. In some applications, such SiON formation may be minimized, while in other applications, the formation of SiON is desirable. Advantageously, it has been found that the reducing agent, as disclosed herein, is consistently effective at preventing or achieving negligible levels of oxidation of the metal or metal nitride over a wide range of concentrations. However, the nitrogen incorporation varies with the reducing agent concentration and temperature. As a result, it has been found that the reducing agent can be varied to achieve desired levels of nitrogen incorporation, while still keeping oxidation of the metal nitride negligible.

In addition, it will be appreciated that the oxidation temperature can be chosen based upon, among other things, the identity of the reducing agent, the desired reactivity with exposed surfaces of the partially-fabricated integrated circuit 100, and the reactivity of chemical species within the partially-fabricated integrated circuit 100. For example, the oxidation temperature can be chosen to prevent undesired premature decomposition of the reducing agent, and/or undesired reactions between chemical species within the partially-fabricated integrated circuit 100, while achieving sufficient oxidation of exposed silicon surfaces.

It has been found that selective oxidation temperatures below about 850° C. provide a relatively uniform reduction of oxygen in the TiN film when a reducing agent is added, relative to an oxidation without a reducing agent. In some embodiments, the amount of oxygen in the TiN film is reduced by an order of magnitude. At about 900° C. or above, the oxygen reduction in the bulk TiN is similar, but it has been found that the level of oxygen at the interface of the TiN and $SiO_2$ increased, e.g., by an order of magnitude relative to the oxygen level before the anneal. Without being limited by theory, it is believed that this increase is due to reaction between TiN and $SiO_2$ at their interface. In some embodiments, the anneal is performed at about 850° C. to achieve a relatively uniform oxygen distribution in the TiN film and prevent reactions between TiN and $SiO_2$.

In some embodiments, the reducing agent is a nitrogen-containing compound, e.g., $NH_3$. Examples of other nitrogen-containing reducing agents include hydrazine ($N_2H_4$), methylhydrazine ($N_2H_{4-n}(CH_3)_n$ n=1-4), ethyl hydrazine ($N_2H_{4-n}(C_2H_5)_n$ n=1-4), other organic hydrazines having carbon chains of 1 to 4 carbon atoms, saturated with hydrogen or one or more of the hydrogen atoms substituted by a halide and not containing oxygen, ammonia ($NH_3$) and any combination thereof.

In some other embodiments, the reducing agent is an organic reducing agent having at least one functional group selected from the group consisting of an alcohol (—OH), an aldehyde (—CHO), and a carboxylic acid (—COOH). Advantageously, organic reducing agents can be chosen to be free of nitrogen, thereby preventing the nitridation of the oxidized semiconductor, as can occur during anneals with nitrogen-containing reducing agents.

To prevent undesired decomposition of the organic reducing agent, the selective oxidation ambient is preferably free from oxygen or have a very low oxygen content, as the presence of oxygen results in oxidation of the compound. The presence of water vapor is not a problem as, unlike is the case with oxygen, it has not been found to result in oxidation of the organic compound. It has been found that the thermal stability in the absence of oxygen of many of the above mentioned organic compounds is surprisingly good: they can easily withstand temperatures of about 800 to about 900° C. whereas in the presence of oxygen they will start to oxidize at a few hundred degrees centigrade.

In some embodiments, reducing agents containing at least one alcohol group are selected from the group consisting of primary alcohols, secondary alcohols, tertiary alcohols, polyhydroxy alcohols, cyclic alcohols, aromatic alcohols, halogenated alcohols, and other derivatives of alcohols.

Examples of primary alcohols include alcohols having an —OH group attached to a carbon atom which is bonded to another carbon atom, such as primary alcohols according to the general formula (I):

$$R^1\text{—OH} \quad (I)$$

wherein $R^1$ is a linear or branched $C_1$-$C_{20}$ alkyl or alkenyl groups, preferably methyl, ethyl, propyl, butyl, pentyl or hexyl groups. Examples of primary alcohols include methanol, ethanol, propanol, butanol, 2-methyl propanol and 2-methyl butanol.

Examples of secondary alcohols include alcohols having an —OH group attached to a carbon atom that is bonded to two other carbon atoms, such as secondary alcohols having the general formula (II):

(II)

wherein each $R^1$ is selected independently from the group of linear or branched $C_1$-$C_{20}$ alkyl and alkenyl groups, preferably methyl, ethyl, propyl, butyl, pentyl or hexyl groups. Examples of secondary alcohols include 2-propanol and 2-butanol.

Examples of tertiary alcohols include alcohols having an —OH group attached to a carbon atom that is bonded to three other carbon atoms, such as tertiary alcohols having the general formula (III):

(III)

wherein each $R^1$ is selected independently from the group of linear or branched $C_1$-$C_{20}$ alkyl and alkenyl groups, preferably methyl, ethyl, propyl, butyl, pentyl or hexyl groups. An example of a tertiary alcohol is tert-butanol.

Some examples of polyhydroxy alcohols, such as diols and triols, have primary, secondary and/or tertiary alcohol groups as described above. Examples of preferred polyhydroxy alcohol are ethylene glycol and glycerol.

Some examples of cyclic alcohols have an —OH group attached to at least one carbon atom which is part of a ring of 1 to 10, or 5-6 carbon atoms.

Examples of aromatic alcohols include aromatic alcohols having at least one —OH group attached either to a benzene ring or to a carbon atom in a side chain. Examples of aromatic alcohols include benzyl alcohol, o-, p- and m-cresol and resorcinol.

Examples of halogenated alcohols include alcohols having the general formula (IV):

$$CH_nX_{3-n}\text{—}R^2\text{—OH} \quad (IV)$$

wherein X is selected from the group consisting of F, Cl, Br and I, n is an integer from 0 to 2 and $R^2$ is selected from the group of linear or branched $C_1$-$C_{20}$ alkyl and alkenyl groups, such as methyl, ethyl, propyl, butyl, pentyl or hexyl groups. In some embodiments, X is selected from the group consisting of F and Cl and $R^2$ is selected from the group consisting of methyl and ethyl groups. An example of a preferred halogenated alcohol is 2,2,2-trifluoroethanol.

Other preferred derivatives of alcohols include amines, such as methyl ethanolamine.

Examples of reducing agents containing at least one aldehyde group (—CHO) include compounds selected from the group consisting of compounds having the general formula (V), alkanedial compounds having the general formula (VI), halogenated aldehydes and other derivatives of aldehydes.

Thus, in one embodiment the reducing agent is an aldehyde having the general formula (V):

$$R^3\text{—CHO} \quad (V)$$

wherein $R^3$ is selected from the group consisting of hydrogen and linear or branched $C_1$-$C_{20}$ alkyl and alkenyl groups, preferably methyl, ethyl, propyl, butyl, pentyl or hexyl groups. In some embodiments, $R^3$ is selected from the group consisting of methyl or ethyl groups. Examples of compounds according to formula (V) are formaldehyde, acetaldehyde and butyraldehyde.

In some other embodiments, the reducing agent is an aldehyde having the general formula (VI):

$$OHC\text{—}R^4\text{—CHO} \quad (VI)$$

wherein $R^4$ is a linear or branched $C_1$-$C_{20}$ saturated or unsaturated hydrocarbon. Alternatively, the aldehyde groups may be directly bonded to each other ($R^4$ is null or omitted).

Reducing agents containing at least one —COOH group may be selected from the group consisting of compounds of the general formula (VII), polycarboxylic acids, halogenated carboxylic acids and other derivatives of carboxylic acids.

Thus, in some embodiments the reducing agent is a carboxylic acid having the general formula (VII):

$$R^5\text{—COOH} \quad (VII)$$

wherein $R^5$ is hydrogen or linear or branched $C_1$-$C_{20}$ alkyl or alkenyl group, such as methyl, ethyl, propyl, butyl, pentyl or hexyl, more preferably methyl or ethyl groups. Examples of compounds according to formula (VII) are formic acid and acetic acid.

It will be appreciated that the various reducing agents disclosed herein can be used singly during the post oxidation anneal or in combination with one another.

EXAMPLES

Substrates having 45 nm thick PVD blanket TiN films deposited on $SiO_2$ and bare Si substrates were subjected to oxidation processes under various conditions. Although these TiN films are thicker than the films normally used in actual devices, they allowed SIMS thickness profiles to be measured with good depth resolution which can provide information about the oxidation mechanism and allows distinguishing between the interfaces and the bulk of the film.

A plurality of the substrates were loaded into an A412™ batch reactor, commercially available from ASM International, N.V. of Almere, the Netherlands. The substrates were oxidized using the conditions and flow rates noted in FIGS. 5-10. $N_2$ and $H_2$ were used as carrier gases. $NH_3$ was used as the reducing agent. The skilled artisan will understand that the volume percent of the $NH_3$ in the process chamber can be calculated by determining the volume percent of the $NH_3$ in the flow of gas entering the process chamber. In most instances, a $NH_3$ flow rate of 0.1 slm corresponds to a $NH_3$ concentration of about 0.4 vol. %, a $NH_3$ flow rate of 0.5 slm corresponds to a $NH_3$ concentration of about 2 vol. %, and a $NH_3$ flow rate of 2.5 slm corresponds to a $NH_3$ concentration of about 10 vol. %.

$H_2O$ was used as the oxidant. The $H_2O$ was flowed into the process chamber by diverting part of the $H_2$ flow to a bubbler maintained at a temperature of 20.8° C. and containing the $H_2O$, and then conducting the $H_2+H_2O$ flow into the process chamber. The $H_2O$ partial pressure as indicated in the Figures is calculated from the flow rate of the $H_2$ assuming a saturated $H_2O/H_2$ flow, taking 18.4 Torr for the saturated vapor pressure of $H_2O$, and taking into account the fraction of the $H_2$ flow relative to the total flow.

The various experiments showed the effectiveness of a reducing agent in reducing oxidation of a metal nitride and also the large concentration window in which the reducing agent is effective. In each of FIGS. 5-7, a high oxygen concentration was found at the surface of the metal nitride, indicating the presence of a native metal oxide, e.g., $TiO_2$, at the surface of the metal nitride. Vertical lines at about 530 Å indicate the thickness of the metal nitride (TiN in these experiments). Underlying the metal nitride is a silicon oxide layer.

Figure 5:
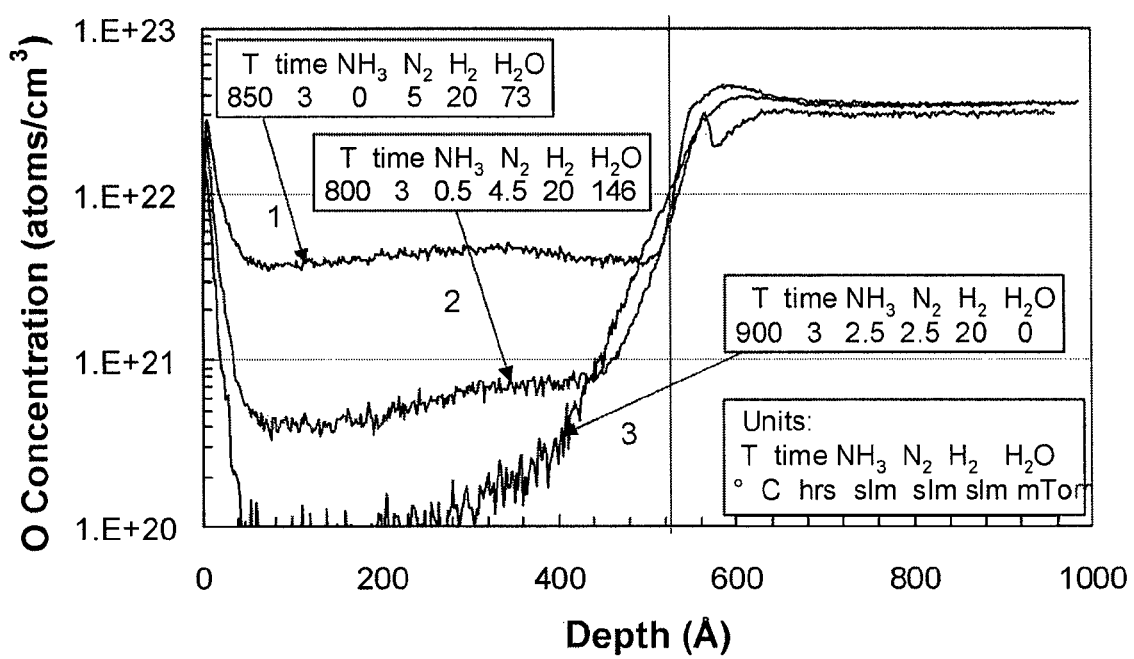
FIG. 5 shows oxygen SIMS plots of TiN after being subjected to an oxidation process with varying levels of reducing agent at different temperatures, according to some embodiments of the invention.

With reference to FIG. 5, oxygen SIMS plots show the concentration of oxygen as a function of depth after an oxidation. The oxidation was performed with and without a reducing agent, and at different temperatures. The oxidation was performed at temperatures from about 800° C. to about 900° C.

With continued reference to FIG. 5, the oxygen concentration was highest when no reducing agent was added during the oxidation. The addition of the reducing agent resulted in at least an order of magnitude reduction in the oxygen concentration, relative to not adding any reducing agent. At about 800° C., the reduction was highly uniform over the depth of the metal nitride. At a higher temperature of about 900° C. and a higher reducing agent concentration, the oxygen concentration was found to be lower in the bulk of the film but to increase with increasing proximity to the underlying silicon oxide. Without being limited by theory, it is believed that increase is due to interaction of the silicon oxide with the metal nitride. In cases in which an oxide or other oxygen-containing material does not contact the metal nitride, this increase in oxygen concentration does not occur. The relatively flat oxygen concentration profile in the bulk of the film for conditions 1 and 2 indicates that the mobility of the oxygen atoms in the TiN film is high. Although TiN is a good diffusion barrier for metals, it is not such a good barrier for oxygen.

Figure 6:
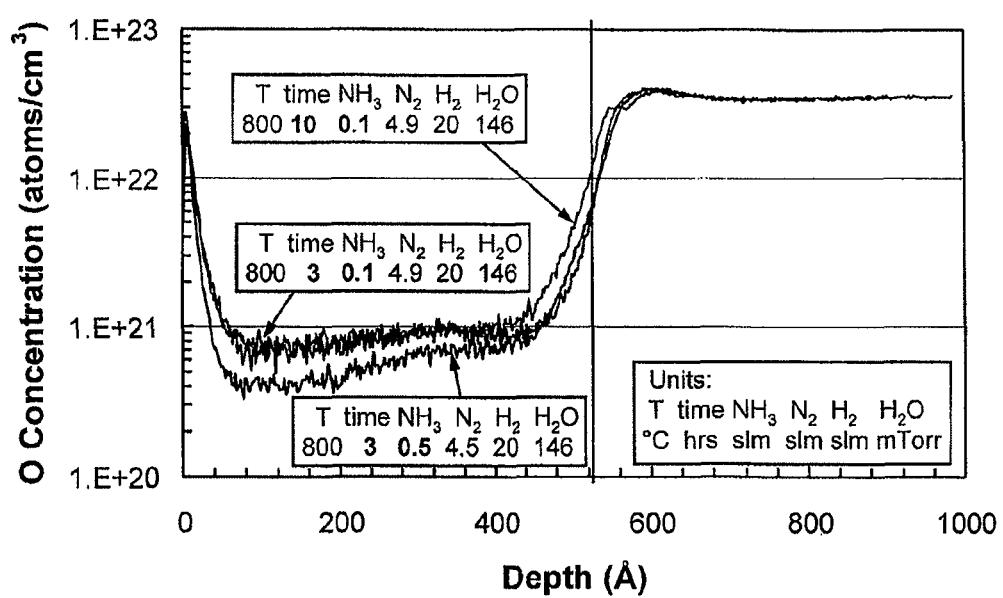
FIG. 6 shows oxygen SIMS plots of TiN after being subjected to an oxidation process with varying levels of reducing agent and varying oxidation durations at 800° C., according to some embodiments of the invention.

With reference to FIG. 6, the duration of the oxidation and the concentration of the reducing agent were varied, with the temperature kept constant at 800° C. The oxygen concentration was highly uniform over the thickness of the metal nitride layer, with higher levels of oxygen at the boundaries due to the presence of $TiO_2$ at the upper surface and the interaction with the silicon oxide at the lower surface. Notably, increasing the duration of the oxidation by over three-fold did not significantly change the oxygen concentration. In addition, increasing the reducing agent concentration five-fold resulted in only a modest further decrease in the oxygen concentration.

Figure 7:
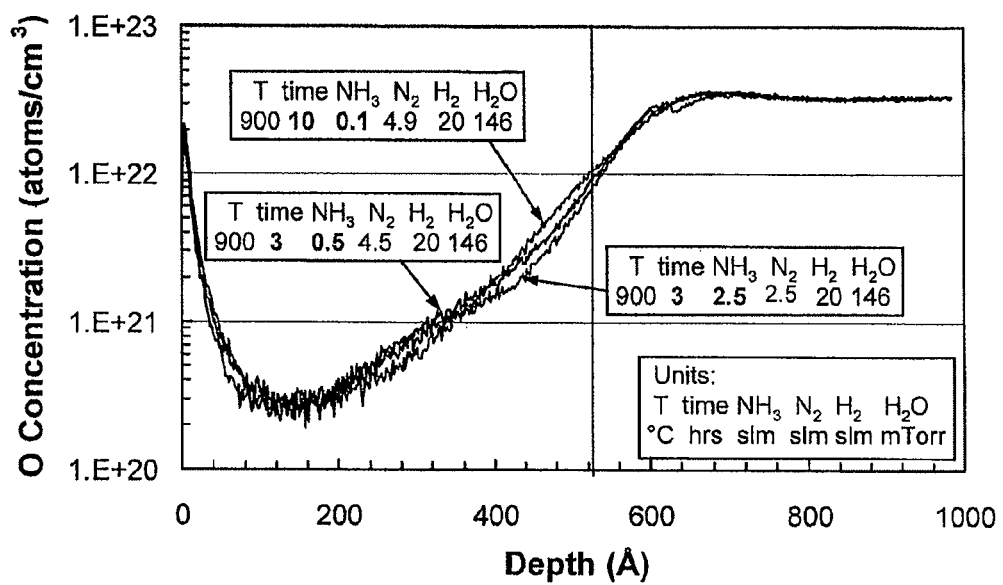
FIG. 7 shows oxygen SIMS plots of TiN after being subjected to an oxidation process with varying levels of reducing agent and varying oxidation durations at 900° C., according to some embodiments of the invention.

With reference to FIG. 7, the duration of the oxidation and the concentration of the reducing agent were varied, with the temperature kept constant at 900° C. After decreasing below the surface of the metal nitride layer, the oxygen concentration increased with increasing proximity to the underlying silicon oxide. Without being limited by theory, this is believed to be caused by interactions between the metal nitride and the oxide, resulting in movement of oxygen into the metal nitride. Notably, increasing the duration of the oxidation over three-fold and changing the reducing agent concentration five-fold did not significantly change the oxygen concentration.

In all of the FIGS. 5-7, the addition of a slight concentration of $NH_3$ was sufficient to reduce the oxygen concentration in an interior a part of the TiN film to a level below about $1 \times 10^{21}$ atoms/cm$^3$.

Figure 8:
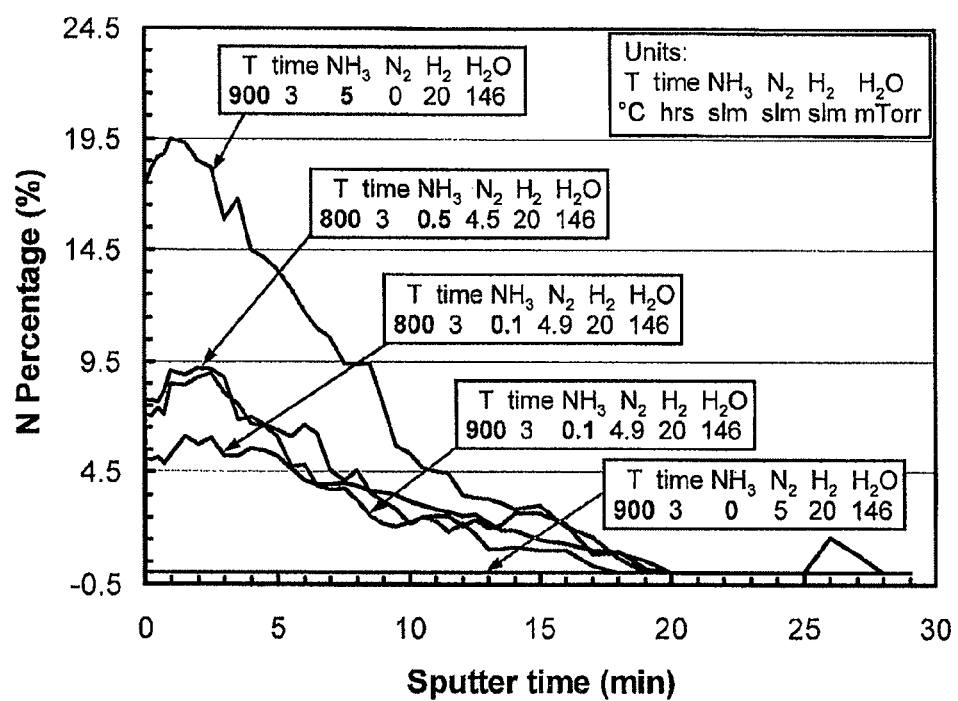
FIG. 8 shows plots of the percentage of nitrogen in silicon oxide formed by selective oxidation with varying levels of reducing agent present at different temperatures, according to some embodiments of the invention.

With reference to FIG. 8, the incorporation of nitrogen into the silicon oxide was analyzed, with oxidation temperature and reducing agent concentrations varied. The nitrogen incorporation was found to increase with increasing temperature and increasing concentrations of the reducing agent. For the highest $NH_3$ concentration (5 slm at a total flow of 25 slm=20 vol. %) the nitrogen concentration in a surface region of the silicon oxide was about 20 at %. Reducing the $NH_3$ concentration resulted in nitrogen concentrations of 10 at % or lower.

Figure 9:
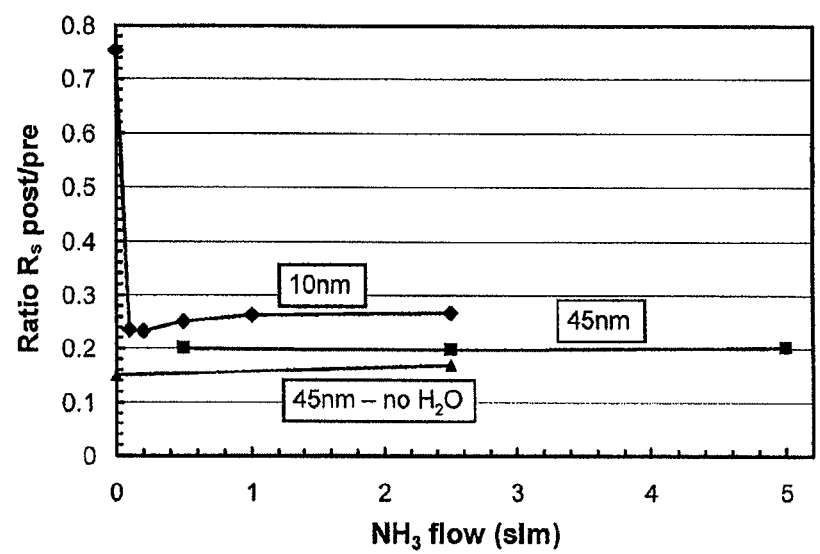
FIG. 9 shows plots of the ratio of the sheet resistance ($R_s$) after the selective oxidation and before the selective oxidation ($R_{s\ post\text{-}oxidation}/R_{s\ pre\text{-}oxidation}$) for various reducing agent concentrations, according to some embodiments of the invention.

With reference to FIG. 9, the ratio of the sheet resistance ($R_s$) after the selective oxidation and before the selective oxidation ($R_{s\ post-oxidation}/R_{s\ pre-oxidation}$) was analyzed for TiN films of varying thicknesses (10 nm and 45 nm). The oxidation was performed for 3 hours at 900° C., a $H_2O$ partial pressure of 146 mTorr and a reducing agent flow ($NH_3$ flow) as indicated in the figure. In addition, $N_2$ was flowed directly into the process chamber at 4.5 slm and $H_2$ was flowed directly into the process chamber at 20 slm. As a reference, a 45 nm thick TiN layer was processed under the same conditions, but without flowing $H_2O$ into the chamber. The $R_{s\ post-oxidation}/R_{s\ pre-oxidation}$ for this reference was 0.16. The reduction of the sheet resistance of the reference samples is due to the annealing in $H_2/N_2$ and relates to an improvement of the structure of the film. For the other samples, the change in sheet resistance is a combination of a reduction in sheet resistance because of the annealing effect and an increase in resistance due to oxidation of the TiN film. As can be seen, the addition of the $NH_3$ reducing agent resulted in advantageously low $R_{s\ post-oxidation}/R_{s\ pre-oxidation}$ ratios of about 0.2 for the 45 nm film and about 0.24-0.27 for the 10 nm film. Notably, the addition of the reducing agent was effective over a wide range of concentrations.

Figure 10:
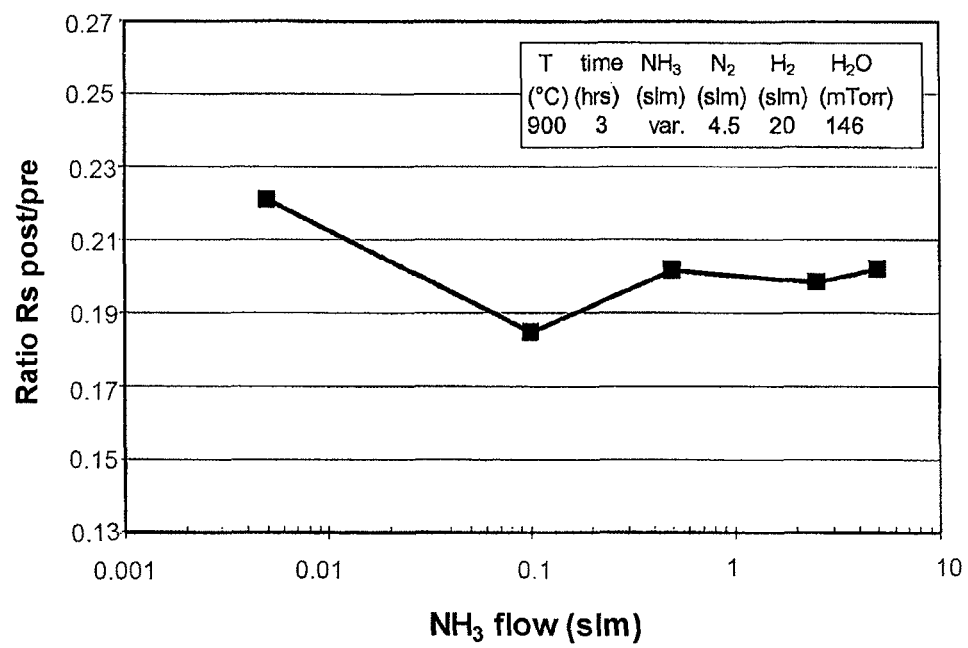
FIG. 10 shows a plot, in detail, of the ratio of the sheet resistance ($R_s$) after the selective oxidation and before the selective oxidation ($R_{s\ post\text{-}oxidation}/R_{s\ pre\text{-}oxidation}$) for various reducing agent concentrations, according to some embodiments of the invention.

With reference to FIG. 10, the ratio of the sheet resistance ($R_s$) after the selective oxidation and before the selective oxidation ($R_{s\ post-oxidation}/R_{s\ pre-oxidation}$) for a TiN film of 45 nm thicknesses was investigated over a wider range of $NH_3$ flows, extending to smaller $NH_3$ flows. The $R_{s\ post-oxidation}/R_{s\ pre-oxidation}$ varied between about 0.22 and about 0.19, further indicating the effectiveness of the reducing agent ($NH_3$ in this example) to "protect" the TiN film from oxidation. $NH_3$ concentrations of about 0.2 vol. % (0.05 slm $NH_3$ in 25 slm) were found to be effective.

It will be appreciated that while the illustrated embodiments describe a partially-fabricated integrated circuit having a transistor stack having a TiN layer, various other structures having exposed metal or metal nitride and silicon portions may be selectively oxidized, so that silicon is selectively oxidized relative to a metal or metal nitride. In some embodiments, a transistor stack may be provided having a TiN passivation layer (e.g., formed by methods described herein) instead of or in addition to one or more other TiN layers. The skilled artisan will also appreciate that other metal-containing layers, besides TiN, may benefit from the use of the anneal with a reducing agent, as described herein. For example, one skilled in the art will appreciate that a semiconductor structure having layers of other metals (including metal nitrides), in addition to or in place of TiN, may be used as well, including structures having tungsten nitride. For example, $TaN_x$, $WN_x$, $MoN_x$ and $NbN_x$ can be used instead of TiN as these nitrides have similar properties as TiN. Further, $VN_x$, $HfN_x$ and $ZrN_x$ can be considered. More generally, the invention can be applied to structures comprising transition metals and/or transition metal nitrides.

In addition, it will be appreciated that the transistor structure may, in some embodiments, include one or more conductive layers and insulating layers above a substrate, which typically includes silicon. The transistor structure may include a patterned gate structure wherein the titanium metal gate layer is formed over a gate dielectric. In some embodiments, the titanium metal gate layer may serve as a control gate above a "floating gate," often comprising polysilicon, which may store charge or data as part of a transistor memory device, such as a dynamic random access memory (DRAM) device or FLASH memory device.

Accordingly, it will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

We claim:

1. A method, comprising:
   providing a partially-fabricated integrated circuit, wherein the partially-fabricated integrated circuit includes an exposed metal-containing portion and an exposed silicon portion;
   exposing the partially-fabricated integrated circuit to a vapor phase atmosphere containing a vapor phase oxidant and a reducing agent, the reducing agent at a concentration of about 1 vol % or less; and
   while the partially-fabricated integrated circuit is exposed to the vapor phase atmosphere, conducting a non-plasma selective oxidation of the exposed silicon portion at a temperature of 650° C. to 850° C. to form a thermal silicon oxide layer having a thickness of about 0.5 nm or more,
   wherein the reducing agent comprises at least one of:
     $NH_3$;
     $N_2H_4$;
     $N_2H_{4-n}(CH_3)_n$, wherein n=1-4;
     $N_2H_{4-n}(C_2H_5)_n$, wherein n=1-4;
     an organic hydrazine, other than $N_2H_{4-n}(CH_3)_n$ wherein n=1-4 and $N_2H_{4-n}(C_2H_5)_n$ wherein n=1-4, the organic hydrazine having carbon chains of 1 to 4 carbon atoms, saturated with hydrogen or one or more of the hydrogen atoms substituted by a halide and not containing oxygen; and
   an organic reducing agent comprising at least one functional group selected from the group consisting of an alcohol group (—OH), an aldehyde group (—CHO), and a carboxylic acid group (—COOH).

2. The method of claim 1, wherein the concentration of the reducing agent is about 0.4 vol % or less.

3. The method of claim 1, further comprising flowing the reducing agent with a carrier gas comprising $H_2$ and $N_2$.

4. The method of claim 1, wherein the organic reducing agent with the alcohol group is selected from the group consisting of primary alcohols, secondary alcohols, tertiary alcohols, polyhyrdroxyalcohols, cyclic alcohols, and halogenated alcohols.

5. The method of claim 1, wherein the organic reducing agent with the aldehyde group is selected from the group consisting of:
   compounds having the general formula $R^3$—CHO, wherein $R^3$ is hydrogen or a linear or branched $C_1$-$C_{20}$ alkyl or alkenyl group;
   compounds having the general formula OHC—$R^4$—CHO, wherein $R^4$ is a linear or branched $C_1$-$C_{20}$ saturated or unsaturated hydrocarbon;
   a compound of the formula OHC—CHO;
   halogenated aldehydes; and
   non-halogenated derivatives of aldehydes.

6. The method of claim 1, wherein the organic reducing agent with the carboxylic acid group is selected from the group consisting of:
   compounds of the general formula $R^5$COOH, wherein $R^5$ is hydrogen or a linear or branched $C_1$-$C_{20}$ alkyl or alkenyl group;
   polycarboxylic acids;
   halogenated carboxylic acids; and
   non-halogenated derivatives of carboxylic acids.

7. The method of claim 1, wherein the vapor phase oxidizing agent is $H_2O$.

8. The method of claim 1, wherein the metal-containing portion comprises a transition metal.

9. The method of claim 1, wherein the metal-containing portion is a metal nitride.

10. The method of claim 9, wherein the metal nitride is TiN.

11. The method of claim 10, wherein the metal-containing portion forms part of a transistor gate stack.

12. The method of claim 11, wherein the exposed silicon structure defines source and drain regions adjacent the transistor gate stack.

13. The method of claim 1, wherein oxidizing the exposed silicon portion forms a silicon oxide layer with a thickness of about 1.0 nm or more.

14. A method, comprising:
   providing a partially-fabricated electronic device having an exposed metal-containing portion and an exposed silicon portion; and
   conducting a non-plasma selective oxidation of the exposed silicon portion at a temperature of 650° C. to 850° C., wherein selectively oxidizing comprises:
     exposing the exposed silicon and metal-containing portions to a vapor phase oxidant to form a thermal silicon oxide layer with a thickness of about 0.5 nm or more; and
     exposing the exposed silicon and metal-containing portions to a reducing agent at a concentration of about 1 vol % or less during oxidizing, wherein an oxygen concentration in the exposed metal-containing portion is about 2 atomic % or less and a nitrogen concentration at an exposed surface of the silicon portion is about 20 atomic % or less after oxidizing.

15. The method of claim 14, wherein the partially-fabricated electronic device is a partially-fabricated transistor.

16. The method of claim 14, wherein the exposed silicon-containing portion has a surface nitrogen concentration of about 10% or less after oxidizing the exposed silicon portion.

17. The method of claim 16, wherein an interior part of the metal-containing portion has an oxygen concentration of about $1 \times 10^{21}$ atoms/cm$^3$ or less after oxidizing the exposed silicon portion.

18. The method of claim 14, wherein the reducing agent is $NH_3$.

19. The method of claim 14, wherein the reducing agent is selected from the group consisting of $N_2H_4$; $N_2H_{4-n}(CH_3)_n$, wherein n=1-4; $N_2H_{4-n}C_2H_5)_n$, wherein n=1-4; other organic hydrazines having carbon chains of 1 to 4 carbon atoms, saturated with hydrogen or one or more of the hydrogen atoms substituted by a halide and not containing oxygen.

20. The method of claim 1, wherein the silicon oxide layer is formed in no more than 3 hours of selectively oxidizing.

21. The method of claim 14, wherein the silicon oxide layer is formed in no more than 3 hours of selectively oxidizing.

22. A method, comprising:
providing a partially-fabricated integrated circuit, wherein the partially-fabricated integrated circuit includes an exposed metal-containing portion and an exposed silicon portion;
exposing the partially-fabricated integrated circuit to a vapor phase atmosphere containing a vapor phase oxidant and a reducing agent, the reducing agent at a concentration of about 1 vol % or less; and
while the partially-fabricated integrated circuit is exposed to the vapor phase atmosphere, conducting a non-plasma selective oxidation of the exposed silicon portion at a temperature of 800° C. to 900° C. to form a thermal silicon oxide layer having a thickness of about 0.5 nm or more,
wherein the reducing agent comprises at least one of:
   $NH_3$;
   $N_2H_4$;
   $N_2H_{4-n}(CH_3)_n$, wherein n=1-4;
   $N_2H_{4-n}(C_2H_5)_n$, wherein n=1-4;
   an organic hydrazine, other than $N_2H_{4-n}(CH_3)_n$ wherein n=1-4 and $N_2H_{4-n}(C_2H_5)_n$ wherein n=1-4, the organic hydrazine having carbon chains of 1 to 4 carbon atoms, saturated with hydrogen or one or more of the hydrogen atoms substituted by a halide and not containing oxygen; and
   an organic reducing agent comprising at least one functional group selected from the group consisting of an alcohol group (—OH), an aldehyde group (—CHO), and a carboxylic acid group (—COON).

23. A method, comprising:
providing a partially-fabricated electronic device having an exposed metal-containing portion and an exposed silicon portion; and
conducting a non-plasma selective oxidation of the exposed silicon portion at a temperature of 800° C. to 900° C., wherein the non-plasma selective oxidation comprises:
exposing the exposed silicon and metal-containing portions to a vapor phase oxidant to form a thermal silicon oxide layer with a thickness of about 0.5 nm or more; and
exposing the exposed silicon and metal-containing portions to a reducing agent at a concentration of about 1 vol % or less during oxidizing, wherein an oxygen concentration in the exposed metal-containing portion is about 2 atomic % or less and a nitrogen concentration at an exposed surface of the silicon portion is about 20 atomic % or less after oxidizing.

* * * * *

UNITED STATES PATENT AND TRADEMARK OFFICE
CERTIFICATE OF CORRECTION

| | |
|---|---|
| PATENT NO. | : 9,127,340 B2 |
| APPLICATION NO. | : 12/701422 |
| DATED | : September 8, 2015 |
| INVENTOR(S) | : Noiray et al. |

It is certified that error appears in the above-identified patent and that said Letters Patent is hereby corrected as shown below:

In the Claims

In column 12 at line 12, In Claim 4, change "polyhyrdroxyalcohols," to --polyhydroxy alcohols,--.

In column 14 at line 15 (approx.), In Claim 22, change "(-COON)." to --(-COOH).--.

Signed and Sealed this
Twelfth Day of July, 2016

Michelle K. Lee
*Director of the United States Patent and Trademark Office*